(12) United States Patent
Park

(10) Patent No.: US 6,306,758 B1
(45) Date of Patent: Oct. 23, 2001

(54) MULTIPURPOSE GRADED SILICON OXYNITRIDE CAP LAYER

(75) Inventor: Stephen Keetai Park, Cupertino, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/567,534

(22) Filed: May 10, 2000

Related U.S. Application Data

(62) Division of application No. 09/134,525, filed on Aug. 14, 1998.

(51) Int. Cl.[7] ............................................... H01L 21/4763
(52) U.S. Cl. ..................... 438/636; 438/592; 438/593; 438/655; 438/584; 257/576; 257/750
(58) Field of Search ........................ 438/257, 253, 438/396, 381, 584, 655, 592, 593, 636; 257/750, 300, 306, 576

(56) References Cited

U.S. PATENT DOCUMENTS

| | | | |
|---|---|---|---|
| 4,889,583 | 12/1989 | Chen et al. | 438/909 |
| 5,674,356 | 10/1997 | Nagayama | 438/694 |
| 5,679,591 | 10/1997 | Lin et al. | 438/257 |
| 5,918,147 | 6/1999 | Filipiak et al. | 438/636 |
| 5,933,729 | 8/1999 | Chan | 438/257 |
| 6,022,776 | * 2/2000 | Lien et al. | 438/253 |
| 6,114,230 | * 9/2000 | Chang et al. | 438/593 |
| 6,153,470 | * 11/2000 | He et al. | 438/257 |

FOREIGN PATENT DOCUMENTS

| | | |
|---|---|---|
| 07321368A | 12/1995 | (JP) . |
| 08097425A | 4/1996 | (JP) . |

* cited by examiner

*Primary Examiner*—Charles Bowers
*Assistant Examiner*—Hsien-Ming Lee

(57) ABSTRACT

A graded cap layer that reduces the overall height of a layer stack and provides for increased process control during subsequent patterning of the layer stack, is described with a method of making the same. The graded cap layer is configured to function as a cap layer to prevent an underlying silicide layer from lifting, a barrier layer to prevent the underlying silicide layer from being oxidized during subsequent processes, a stop layer to prevent over-etching during subsequent self-aligned source (SAS) patterning processes, and/or an anti-reflective coating (ARC) to improve the resolution of subsequent patterning processes. The graded cap layer is a relatively thin layer of silicon oxynitride with varying concentrations of nitrogen. The cap layer is deposited in a single chemical vapor deposition (CVD) or plasma enhanced chemical vapor deposition (PECVD) chamber.

7 Claims, 3 Drawing Sheets

MULTIPURPOSE GRADED SILICON OXYNITRIDE CAP LAYER

This application is a divisional of Application Ser. No. 09/134,525 filed Aug. 14, 1998.

TECHNICAL FIELD

The present invention relates to semiconductor devices and manufacturing processes, and more particularly to methods and arrangements associated with a multipurpose graded silicon oxynitride cap layer in non-volatile memory semiconductor devices.

BACKGROUND ART

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1a. As shown, memory cell 8 is viewed in a cross-section through the bit line. Memory cell 8 includes a doped substrate 12 having a top surface 11, and within which a source 13a and a drain 13b have been formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional chemical vapor deposition processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1b depicts a cross-section of several adjacent memory cells from the perspective of a cross-section through the word line (i.e., from perspective A, as referenced in FIG. 1a). In FIG. 1b, the cross-section reveals that individual memory cells are separated by isolating regions of silicon dioxide formed on substrate 12. For example, FIG. 1b shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a–b. Interpoly dielectric layer 24 has been conformally deposited over the exposed portions of floating gates 16a–c and field oxides 14a–b. Interpoly dielectric layer 24 isolates floating gates 16a–c from the next conformal layer which is typically a polysilicon layer that is patterned (e.g., along the bit line) to form control gate 26. Interpoly dielectric layer 24 typically includes a plurality of films, such as, for example, a bottom film of silicon dioxide, a middle film of silicon nitride, and a top film of silicon dioxide. This type of interpoly dielectric layer is commonly referred to as an oxide-nitride-oxide (ONO) layer.

The continued shrinking of the memory cells, and in particular the basic features depicted in the memory cells of FIGS. 1a–b, places a burden on the fabrication process to deposit and subsequently pattern a layer stack to form a floating gate/control gate structure, without creating deleterious effects within the resulting memory cells. Of particular concern is the need to control the deposition and patterning processes associated with the layer stack. As such, there is a need to provide a layer stack that is relatively easy to control during deposition and etching, readily adaptable to reduced-size critical dimensions, and cost effective.

SUMMARY OF THE INVENTION

These needs and others are met by the present invention, which provides methods and arrangements that provide a layer stack that is not only cost effective, but more importantly controllable during deposition and etching, and advantageously adaptable to reduced-size critical dimension semiconductor devices.

In accordance with one aspect of the present invention, a graded silicon oxynitride cap layer is employed to reduce the overall thickness or height of the layer stack. The graded silicon oxynitride cap layer is configured to increase process control during patterning of the layer stack and can provide multiple functions. By way of example, in accordance with certain aspects of the present invention, a graded silicon oxynitride cap layer serves as: (1) a cap layer to prevent an underlying silicide layer from lifting; (2) a barrier layer to prevent the underlying silicide layer from being oxidized during subsequent processes; (3) a stop layer to prevent over-etching during subsequent source patterning processes; and/or, (4) an anti-reflective coating (ARC) to improve the resolution associated with the subsequent contact patterning processes.

Thus, in accordance with certain embodiments of the present invention, a cap layer is provided for use in a semiconductor device. The cap layer includes a layer of silicon oxynitride having within it a first region and at least one second region. The first region has a first concentration of nitrogen and the second region has a second concentration of nitrogen, which is lower than the first concentration of nitrogen in the first region. By way of example, in certain other embodiments, the first concentration of nitrogen is at least about 10 atomic percent, and/or the second concentration of nitrogen is between about 2 to about 3 atomic percent. In accordance with still other embodiments of the present invention, the first concentration of nitrogen varies within the first region, and/or the second concentration of nitrogen varies within the second region. By way of example, in certain embodiments, the first and second concentrations of nitrogen are based on at least one mathematical function with respect to the thickness of the layer of silicon oxynitride. By way of example, the mathematical function can include a linear function, a non-linear function, and/or a step function.

The above stated needs and others are met by a semiconductor device provided in accordance with certain other embodiments of the present invention. The semiconductor device includes a substrate, and a layer stack formed on the substrate. The layer stack includes at least two different layers, including a layer of silicon oxynitride. The layer of silicon oxynitride has a first region and at least one second region formed therein. The first region has a first concentration of nitrogen and the second region has a second concentration of nitrogen, which is lower than the first concentration of nitrogen in the first region. In accordance with certain embodiments, layer stack further includes a silicide layer upon which the layer of silicon oxynitride is formed, and at least one layer of polysilicon upon which the silicide is formed as part of a memory cell.

In accordance with still further embodiments of the present invention, a method for preventing lifting of a silicide layer in a semiconductor device is provided. The method includes forming a silicide layer on a first layer within a layer stack, and forming a cap layer on the silicide layer, wherein the cap layer includes nitrogen and has a concentration of nitrogen that varies as a function of the thickness of the cap layer. The cap layer, in accordance with certain embodiments of the present invention, includes a layer of silicon oxynitride having a first portion, wherein the concentration of nitrogen is at least about 10 atomic percent, and a second portion, wherein the concentration of nitrogen is less than about 10 atomic percent.

The foregoing and other features, aspects and advantages of the present invention will become more apparent from the following detailed description of the present invention when taken in conjunction with the accompanying drawings.

BRIEF DESCRIPTION OF THE DRAWINGS

The present invention is illustrated by way of example, and not by way of limitation, in the figures of the accompanying drawings and in which like reference numerals refer to similar elements in which.

DETAILED DESCRIPTION OF EXEMPLARY EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

Figure 1A:
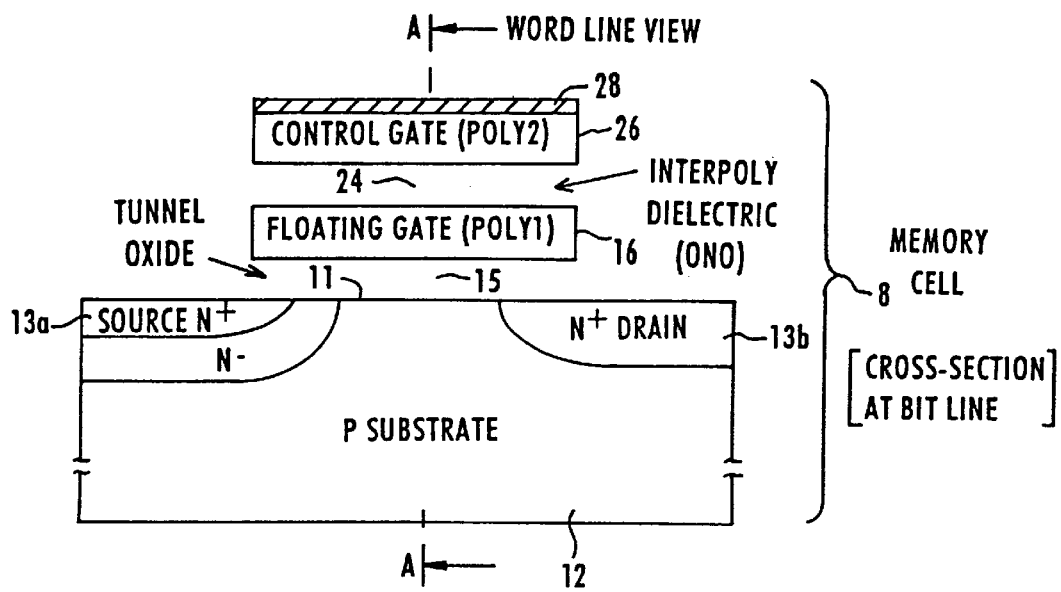
FIG. 1a depicts a cross-sectional view of a portion of a typical prior art semiconductor device having at least one memory cell, as viewed at the bit-line.
Figure 1B:
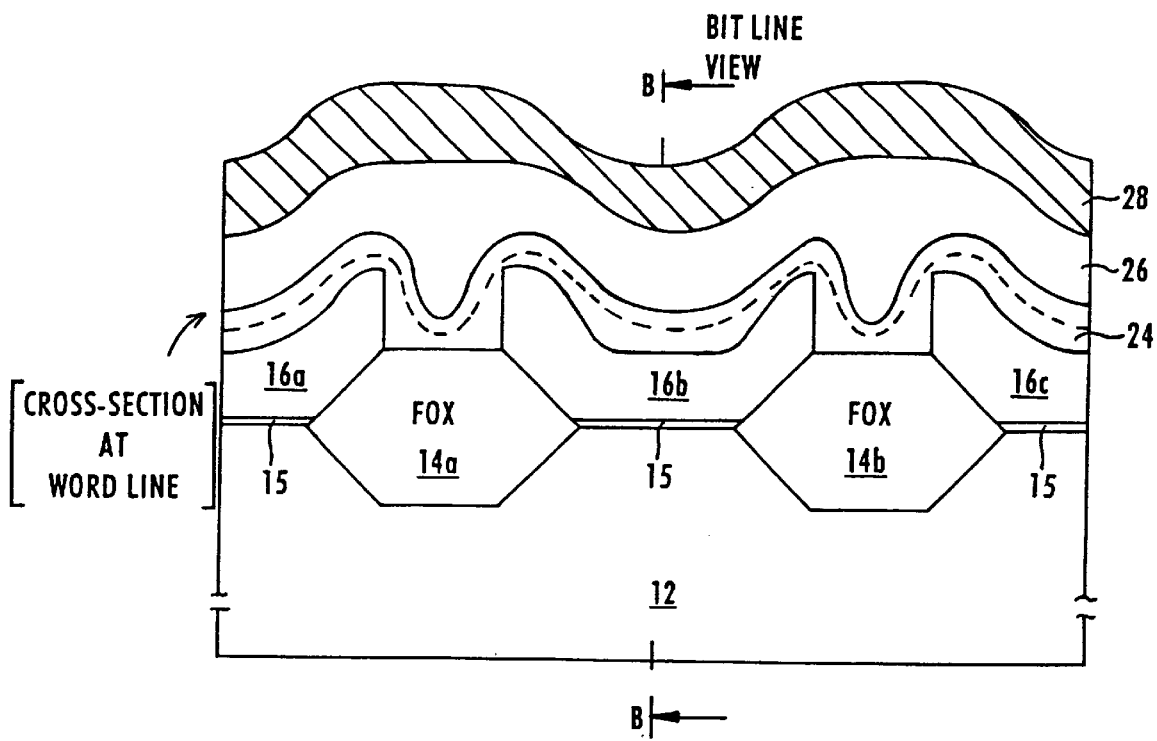
FIG. 1b depicts a cross-sectional view of a portion of a typical prior art semiconductor device, as in FIG. 1, having at least one memory cell, as viewed at the word-line.
Figure 2:
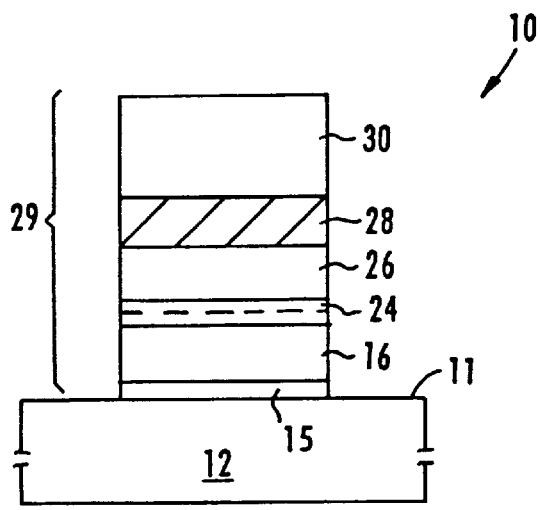
FIG. 2 depicts a cross-sectional view of a portion of a semiconductor device having a patterned conventional layer stack that includes an oxide cap layer.

FIG. 2 depicts a portion 10 of a prior art semiconductor device, as viewed from a cross-sectional perspective through the word line (similar to FIG. 1b). Portion 10 includes a layer stack 29 that has been formed on substrate 12 and subsequently patterned to form a control gate/floating gate structure. Layer stack 29 includes tunnel oxide 15, floating gate 16, interpoly dielectric layer 24, control gate 26, silicide layer 28, and an oxide cap layer 30. Oxide cap layer 30 is usually a relatively thick layer of silicon dioxide that is deposited on silicide layer 28 using conventional chemical vapor deposition (CVD) techniques. Oxide cap layer 30 is used to prevent silicide layer 28 from lifting off control gate 26 during subsequent thermal processing of portion 10. By way of example, the internal stress of silicide layer 28 tends to increase during subsequent rapid thermal anneal (RTA) processes. Oxide cap layer 30 provides the requisite mechanical strength required to hold silicide layer 28 in place following such an RTA process. Oxide cap layer 30 also acts as a barrier layer to prevent silicide layer 28 from being oxidized during subsequent processing.

As mentioned above, oxide cap layer 30 is relatively thick. For example, oxide cap layer 30 is typically 2,000 to 3,000 Angstroms thick. Consequently, the overall thickness or height of layer stack 29 is proportionally increased. This "increased height" tends to make layer stack 29 more difficult to pattern during subsequent etching processes. This is especially true for reduced-size critical dimension semiconductor devices, wherein an "increased height" of layer stack 29 results in a corresponding increase in the etching aspect ratio between adjacent features in an array of memory cells.

Figure 3:
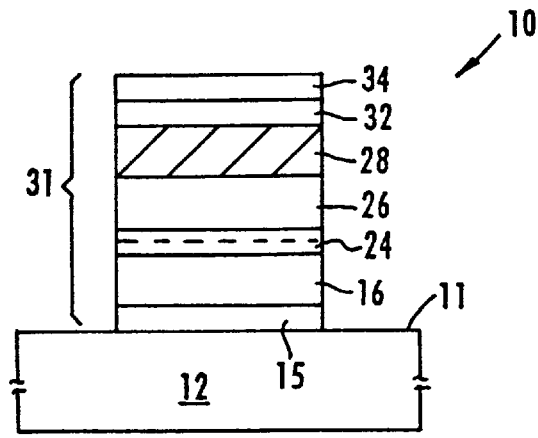
FIG. 3 depicts a cross-sectional view of a portion of a semiconductor device having a patterned layer stack that includes a polysilicon cap layer and a silicon oxynitride stop layer.

FIG. 3 depicts portion 10 with an improved layer stack 31 that includes a polysilicon cap layer 32 and an anti-reflective coating (ARC) layer 34, instead of oxide cap layer 30 (as in FIG. 2). Polysilicon cap layer 32 is deposited on silicide layer 28 using conventional CVD techniques. Polysilicon cap layer 32 typically includes undoped polysilicon and has a thickness of about 500 Angstroms. Polysilicon cap layer 32 is configured to provide the requisite interface and mechanical strength to prevent silicide layer 28 from lifting during subsequent thermal processing, for example, oxidation.

ARC layer 34 is usually deposited on polysilicon cap layer 32, using conventional CVD as a stop layer to prevent over etching during subsequent patterning processes, such as, for example, during the subsequent etching of an overlying oxide layer (not shown) to form spacers that are used to create a self-aligned source (SAS) techniques. ARC layer 34 typically includes silicon oxynitride (e.g., $SiO_xN_y$, wherein x and y represent the atomic percentage of oxygen and nitrogen, respectively) and has a thickness of about 400 Angstroms. As known in the art an ARC layer, such as ARC layer 34, is typically configured to provide increased patterning resolution control during subsequent photolithography masking processes.

Layer stack 31 (in FIG. 3) is a notable improvement over the prior art layer stack 29 (in FIG. 2) because it can be made thinner (e.g., between about 1,100 to 2,100 Angstroms thinner) and also serves as an anti-reflective coating. Thus, layer stack 31 can be employed for many reduced-size critical dimension semiconductor devices. However, layer stack 31 requires two separate deposition processes, namely a polysilicon deposition process and a silicon oxynitride deposition process. This tends to increase the production costs and time since the deposition processes are usually conducted in different deposition tools.

Figure 4:
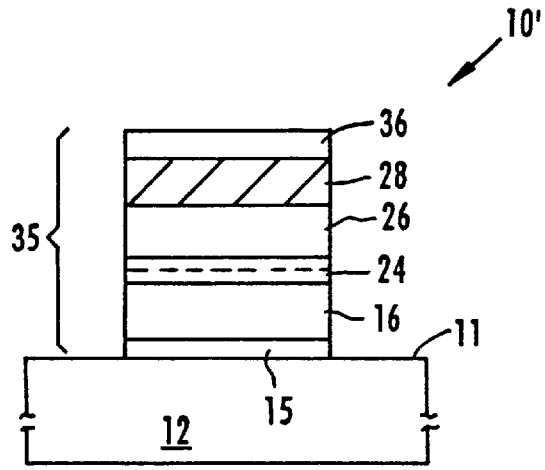
FIG. 4 depicts a cross-sectional view of a portion of a semiconductor device having a patterned layer stack that includes a multipurpose graded silicon oxynitride cap layer, in accordance with certain embodiments of the present invention.

With this in mind, FIG. 4 depicts a portion 10' having a layer stack 35 that includes a graded silicon oxynitride cap layer 36, in accordance with certain embodiments of the present invention. Graded silicon oxynitride cap layer 36 is deposited on silicide layer 28 using conventional CVD or PECVD techniques. Graded silicon oxynitride cap layer 36 is at least about 100 Angstroms thick, more preferably between about 200 and about 1,000 Angstroms thick, and most preferably about 400 Angstroms thick. As its name implies, graded silicon oxynitride cap layer 36 has a graded or varying concentration of nitrogen with regard to its thickness. For example, the concentration (i.e., the atomic percentage) of nitrogen within graded silicon oxynitride cap layer 36 is preferably higher nearer the interface to silicide layer 28. Thus, a nitrogen-rich (N-rich) region exists within graded silicon oxynitride cap layer 36. The N-rich region provides the interface/mechanical strength that prevents lifting of silicide layer 28. The remaining region (i.e., the non- N-rich region) of graded silicon oxynitride cap layer 36 serves as an ARC. Thus, graded silicon oxynitride cap layer 36 eliminates the need for the two separate layers in portion 10 of FIG. 3, namely polysilicon cap layer 32 and ARC layer 34. Moreover, graded silicon oxynitride cap layer 36 is significantly thinner than the combined thickness of the two separate layers in portion 10 in the embodiment of FIG. 3, and substantially thinner than the prior art oxide cap layer 30 in FIG. 2.

In certain embodiments graded silicon oxynitride cap layer 36 is deemed "multipurpose" because it functions as a cap layer to prevent silicide layer 28 from lifting, a barrier layer to prevent silicide layer 28 from being oxidized during subsequent processes, a stop layer to prevent over-etching during subsequent patterning processes (e.g., a SAS related etching process), and/or an ARC to improve the resolution of subsequent patterning processes.

Figure 5:
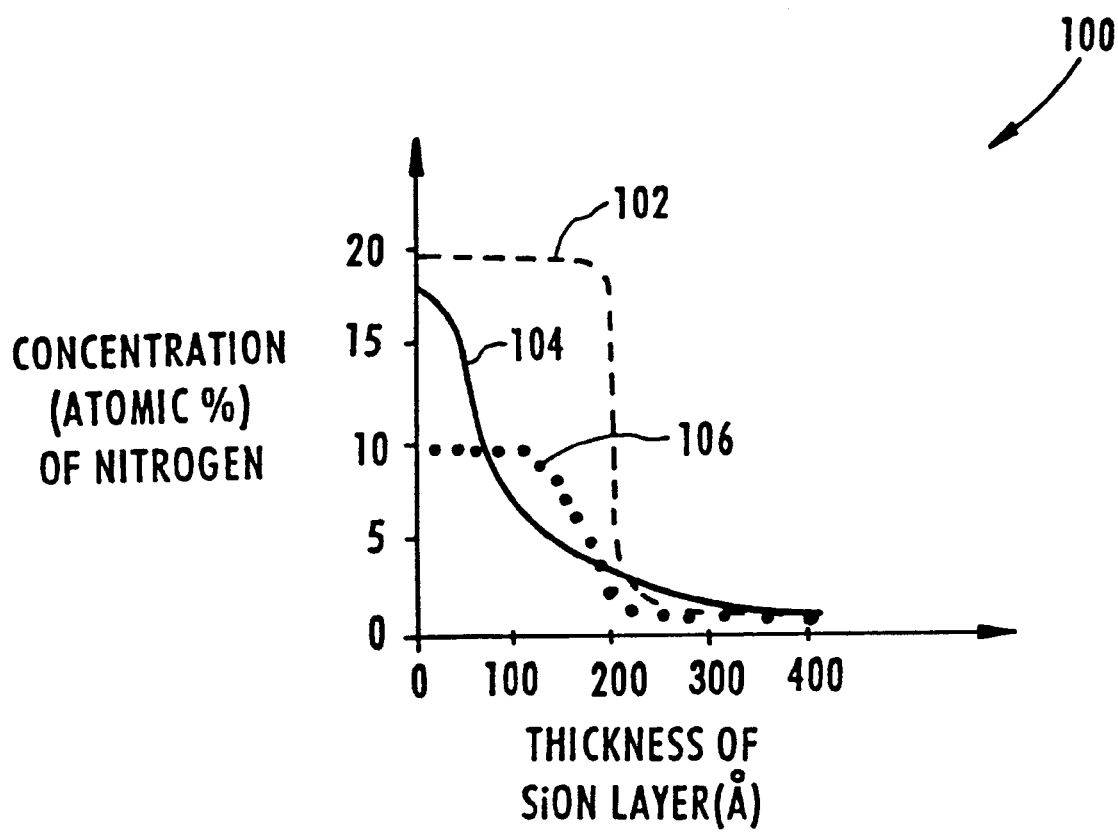
FIG. 5 is a graph depicting the concentration of nitrogen in certain exemplary embodiments of a multipurpose graded silicon oxynitride cap layer, as in FIG. 4, in accordance with certain embodiments of the present invention.

FIG. 5 is a graph depicting the concentration of nitrogen of a graded silicon oxynitride cap layer 36, in accordance with certain exemplary embodiments of the present invention. As shown, the concentration of nitrogen, as an atomic percentage, is depicted on the vertical axis, and the thickness of the graded silicon oxynitride cap layer 36, in Angstroms, is depicted on the horizontal axis. The exemplary embodiments depicted in FIG. 5 have a thickness of about 400 Angstroms. The concentration of nitrogen for each of the various exemplary embodiments is depicted by lines 102, 104 and 106. In a first example, line 102 depicts a step function in which cap layer 36 contains about more than 20% concentration of nitrogen in about the first 200 Angstroms and about a 10–15% concentration of nitrogen in the remaining 200 or so Angstroms. In a second example, line 104 depicts a non-linear function in which cap layer 36 contains about an 18% concentration of nitrogen near the interface of silicide layer 28 (i.e., where the thickness of cap layer 36 is near zero), which non-linearly decreases to about a 10–15% concentration of nitrogen after about 300 Angstroms. In a third example, line 106 depicts a nearly linear function in which cap layer 36 contains about a 30% concentration of nitrogen for about the first 100 Angstroms, which linearly decreases to, and levels off at, about a 10% concentration of nitrogen between about 100 and 400 Angstroms.

As these examples illustrate, the concentration of nitrogen in both the N-rich region and the remaining region of cap layer 36 can be adjusted to match the needs of a particular application/device. Further, the thickness of cap layer 36 can also be adjusted as required. By way of example, the concentration and/or thickness of the N-rich region can be adjusted to provide the necessary strength to prevent silicide layer 28 from lifting, and/or the concentration and/or thickness of the remaining (non-N-rich) region can be adjusted to provide the necessary tuning to act as an ARC. In accordance with certain embodiments of the present invention, the N-rich region of cap layer 36 has at least a 20% concentration of nitrogen, and more preferably between about a 20% to about a 40% concentration of nitrogen. For comparison purposes, ARC layer 34 in FIG. 3 has a substantially uniform concentration of nitrogen of about 10–15% throughout its thickness.

Those of ordinary skill in the art will recognize that the concentration of nitrogen in cap layer 36 can be readily controlled during deposition by altering the amount of nitrogen supplying chemicals present in the CVD (or PECVD) chamber and adjusting the process accordingly. By way of example, cap layer 36 can be deposited in a AMT 5000 deposition chamber available from Applied Materials, Inc., of Santa Clara, Calif., using a $SiH_4+N_2+N_2O$ chemistry, wherein the supply of $N_2O$ is altered, for example, in accord with a function as depicted in FIG. 5, to control the graded concentration of nitrogen in cap layer 36.

The present invention can be adapted for other cap layer materials that include a controllable atomic percentage of nitrogen. By way of example, a silicon oxime (e.g., $Si_{1-(x+y+z)}N_xO_y:H_z$, wherein x, y and z represent the atomic percentage of nitrogen, oxygen and hydrogen, respectively) can be used instead of silicon oxynitride.

An exemplary resulting layer stack 35 for use in a non-volatile memory cell structure, in accordance with certain embodiments of the present invention, is between about 3,500 Angstroms to about 5000 Angstroms in height. In this example, layer stack 35 includes a thin (e.g., about 50 Angstroms thick) tunnel oxide 15 that is thermally grown using conventional deposition techniques on substrate 12. Polysilicon layer 16 is a doped polysilicon layer that is formed on tunnel oxide 15 using conventional deposition techniques, such as, CVD or PECVD techniques to a thickness of about 900 to about 1,100 Angstroms thick. Interpoly dielectric layer 24 is then formed over polysilicon layer 16, using conventional deposition techniques. In certain preferred embodiments of the present invention, interpoly dielectric layer 24 is an ONO layer. An ONO layer is formed, for example, by a three-stage process in which a first film of silicon dioxide (e.g., about 50 Angstroms thick) is deposited or grown on polysilicon layer 16, followed by deposition of a film of silicon nitride (e.g., about 80 Angstroms thick), and then deposition a second film of silicon dioxide (e.g., about 40 Angstroms thick). Polysilicon layer 26 is then formed on interpoly dielectric layer 24 using conventional deposition techniques to a thickness of about 1,200 Angstroms. Silicide layer 28, for example, tungsten silicide (e.g., $WSi_x$), is then formed on top of polysilicon layer 26 using conventional silicide forming techniques to a thickness of between about 1100 to about 1700 Angstroms thick, and more preferably to a thickness between about 1200 to 1500 Angstroms thick. Next, a graded silicon oxynitride cap layer 36 is formed over silicide layer 28, in accordance with certain embodiments of the present invention, for example, as described above and depicted in FIGS. 4 and 5.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A method for preventing lifting of a silicide layer in a semiconductor device, the method comprising:

forming a silicide layer on a first layer within a layer stack; and forming a cap layer on the silicide layer, the cap layer including nitrogen and having a concentration of nitrogen that varies as a function of a thickness of the cap layer.

2. The method as recited in claim 1, wherein the step of forming the cap layer includes forming a layer of silicon oxynitride on the silicide layer.

3. The method as recited in claim 2, wherein the step of forming the layer of silicon oxynitride on the silicide layer includes forming a first portion of silicon oxynitride wherein the concentration of nitrogen is at least about 10 atomic percent.

4. The method as recited in claim 3, wherein the concentration of nitrogen in the first portion of silicon oxynitride is less than about 20 atomic percent.

5. The method as recited in claim 3, wherein the step of forming the layer of silicon oxynitride on the silicide layer further includes forming a second portion of silicon oxynitride having a second concentration of nitrogen that is less than about 10 atomic percent.

6. The method as recited in claim 5, wherein the second concentration of nitrogen within the second portion of silicon oxynitride is between about 2 to about 3 atomic percent.

7. The method as recited in claim 1, further comprising forming the first layer by depositing a layer of polysilicon over a dielectric layer within the layer stack.

* * * * *